US00RE36136E

United States Patent [19]

Higashi et al.

[11] E Patent Number: Re. 36,136

[45] **Reissued Date of Patent: *Mar. 9, 1999**

[54] THERMAL SENSOR

[75] Inventors: Robert E. Higashi, Shorewood; James O. Holmen; Robert G. Johnson, both of Minnetonka, all of Minn.

[73] Assignee: Honeywell Inc., Minneapolis, Minn.

[ * ] Notice: This patent issued on a continued prosecution application filed under 37 CFR 1.53(d), and is subject to the twenty year patent term provisions of 35 U.S.C. 154(a)(2).

[21] Appl. No.: 627,598

[22] Filed: Apr. 4, 1996

Related U.S. Patent Documents

Reissue of:

[64] Patent No.: 5,300,915
Issued: Apr. 5, 1994
Appl. No.: 887,495
Filed: Jul. 16, 1986

[51] Int. Cl.[6] ..... H01L 31/08

[52] U.S. Cl. ..... 338/18; 338/15; 338/225; 338/18; 29/615; 29/2; 250/338.1

[58] Field of Search ..... 338/15, 17, 18, 338/22 R; 29/612; 257/443; 250/338.3, 338.4, 332, 338.1

[56] References Cited

U.S. PATENT DOCUMENTS

| | | | |
|---|---|---|---|
| 3,484,611 | 12/1969 | Futaki . | |
| 3,619,614 | 5/1974 | Yamaka . | |
| 3,629,585 | 12/1971 | Desvignes | 338/18 |
| 3,693,011 | 9/1972 | DeVaux et al. . | |
| 3,801,949 | 4/1974 | Larrabee | 338/22 R |

(List continued on next page.)

FOREIGN PATENT DOCUMENTS

| | | | |
|---|---|---|---|
| 2253214 | 5/1974 | Germany . | |
| 58-131525 | 8/1983 | Japan | 250/338.4 |
| 60-119426 | 6/1985 | Japan . | |
| 61-170626 | 8/1986 | Japan . | |
| 61-195318 | 1/1987 | Japan . | |
| 1-136035 | 5/1989 | Japan . | |
| 3-41305 | 2/1991 | Japan . | |
| 91/16607 | 8/1986 | WIPO . | |

OTHER PUBLICATIONS

E. Basseous, *Fabrication of Novel Three Dimensional Microstructures by the Anisotropic Etching of (100) and (110) Silicon*, 10 IEEE Transactions on Electron Devices, 1178–1185, 1978 (FF).

Kurt E. Peterson, *Dynamic Micromechanics on Silicon: Techniques and Devices*, 10, IEEE Transactions on Electron Devices, 1241–1250, 1978.

(List continued on next page.)

*Primary Examiner*—Teresa J. Walberg
*Assistant Examiner*—Karl Easthom
*Attorney, Agent, or Firm*—Roger W. Jensen; John G. Shudy, Jr.

[57] ABSTRACT

A two-level IR detector imaging array of high fill-factor design. The upper microbridge detector level is spaced above and overlie the integrated circuit and bus lines on the substrate surface below.

34 Claims, 6 Drawing Sheets

U.S. PATENT DOCUMENTS

| | | | |
|---|---|---|---|
| 3,851,174 | 11/1974 | Tynan et al. | 250/332 |
| 3,896,309 | 7/1975 | Halsor et al. . | |
| 3,898,605 | 8/1975 | Burns | 338/18 |
| 4,009,516 | 3/1977 | Chiang et al. . | |
| 4,029,962 | 6/1977 | Chapman | 250/338.4 |
| 4,067,104 | 1/1978 | Tracy | 250/332 |
| 4,115,692 | 9/1978 | Belcarak et al. . | |
| 4,169,273 | 9/1979 | Hendrickson . | |
| 4,239,312 | 12/1980 | Meyer et al. . | |
| 4,286,278 | 8/1981 | Lorenze, Jr. et al. | 250/332 |
| 4,293,768 | 10/1981 | Adachi et al. | 250/338 |
| 4,317,126 | 2/1982 | Gragg . | |
| 4,354,109 | 10/1982 | Gelpey et al. . | |
| 4,365,106 | 12/1982 | Pulvari . | |
| 4,378,489 | 3/1983 | Chabinsky et al. . | |
| 4,463,493 | 8/1984 | Momose . | |
| 4,472,239 | 9/1984 | Johnson et al. | 156/647 |
| 4,574,263 | 3/1986 | Liddiard | 338/18 |
| 4,654,622 | 3/1987 | Foss et al. | 338/14 |
| 4,691,104 | 9/1987 | Murata et al. . | |
| 4,750,834 | 6/1988 | Fately . | |
| 4,754,139 | 6/1988 | Ennulat et al. | 250/332 |
| 4,803,360 | 2/1989 | Ball et al. | 250/338.3 |
| 5,017,784 | 5/1991 | Sher et al. . | |
| 5,455,421 | 10/1995 | Spears . | |

OTHER PUBLICATIONS

Kurt Peterson & Anne Shartel, *Macromechanical Accelerometer Integrated with MOS Detection Circuitry*, IBM Research Facility, 1980.

H. Elabd & W.F. Kosonocky, *Theory and Measurements of Photoresponse for Thin Film $Pd_2Si$ and PtSi Infrared Schottky–Barrier Detectors with Optical Cavity*, 43 RCA Review, 569–588, 1982.

K.C. Liddiard, *Thin Film Resistance Bolometer IR Detectors*, Infrared Phys., vol. 24, No. 1, 57–64, 1984.

M. Okuyama, et al., *Si–Monolithic Integrated Pyroelectric Infrared Sensor Using $PbTiO_3$Thin Film*, 6. International Journal of Infrared and Millimeter Waves, 71–78, 1985.

K.C. Liddiard, *Thin Film Resistance Bolometer IR Detectors*, Infrared Phys., vol. 24, No. 1, 57–64, 1984.

K.C. Liddiard, *Thin–film Resistance Bolometer IR Detectors–II*, Infrared Phys., vol. 26, No. 1, 43–49, 1986.

Suzuld, et al. *An Infrared Detector Using Poly–Silicon p–n Junction Diode*, Tech Digest of 9th Sensor Symposium, 71–74, 1990.

A. Tanaka, et al., *Infrared Linear Image Sensor using a Poly–Si pn Junction Diode Array*, 33 Infrared Phys., 229–236, 1982.

THERMAL SENSOR

Matter enclosed in heavy brackets [ ] appears in the original patent but forms no part of this reissue specification; matter printed in italics indicates the additions made by reissue.

FIELD OF THE INVENTION

The field of the invention is in a two-level infrared bolometer array based on a pitless microbridge detector structure with integrated circuitry on a silicon substrate beneath.

BACKGROUND AND SUMMARY OF THE INVENTION

This invention is directed to a pixel size sensor of an array of sensors for an infrared pitless microbridge construction of high fill factor. In this invention the large fill factor (>75%) is made possible by placing the detector microbridge on a second plane above the silicon surface carrying the integrated diode and bus lines.

Prior art microbridge thermal detector arrays in a silicon substrate have been fabricated and one such example is shown in the U.S. Pat. No. 3,801,949. In these prior art references, the small pixels have a low fill factor because the detector, the bus lines and the diode are all in the same plane each using a substantial share of the available pixel area.

DESCRIPTION

Figure 1:
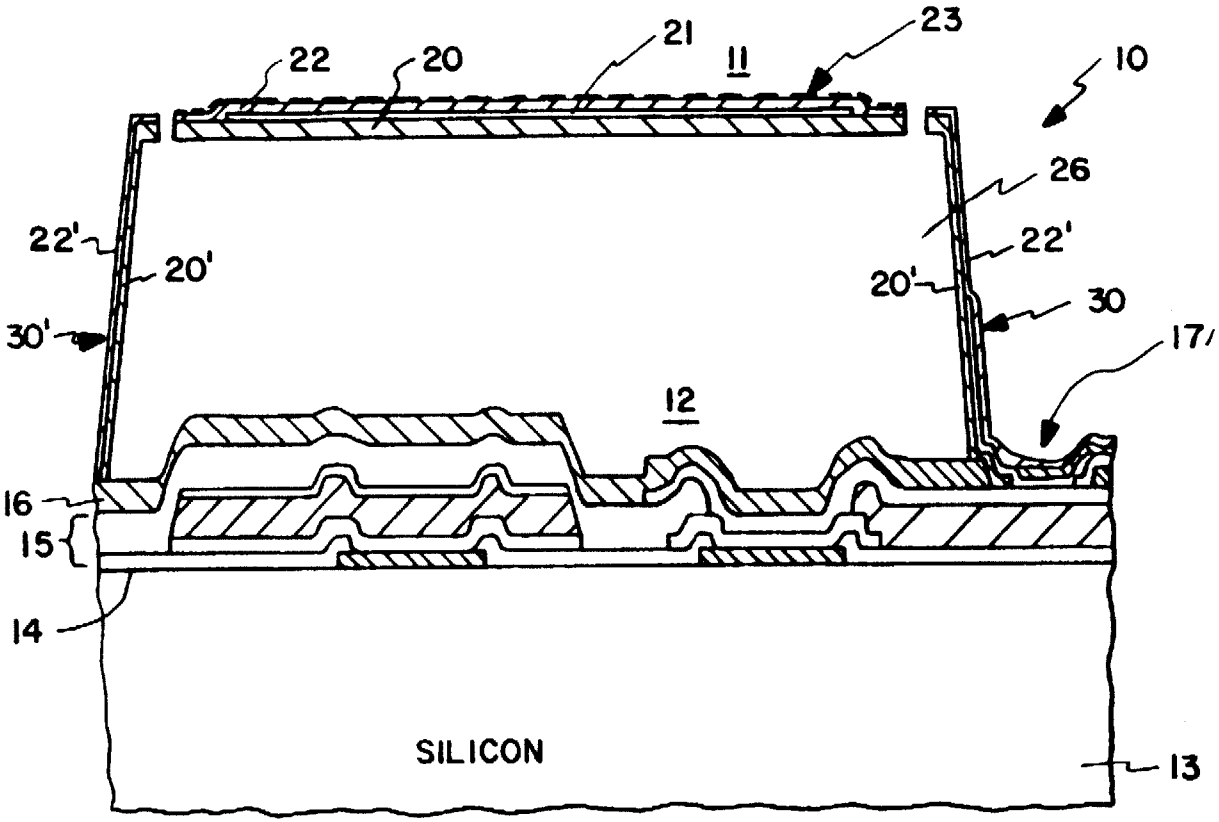
FIG. 1 is an elevation view of the two-level detector.
Figure 2:
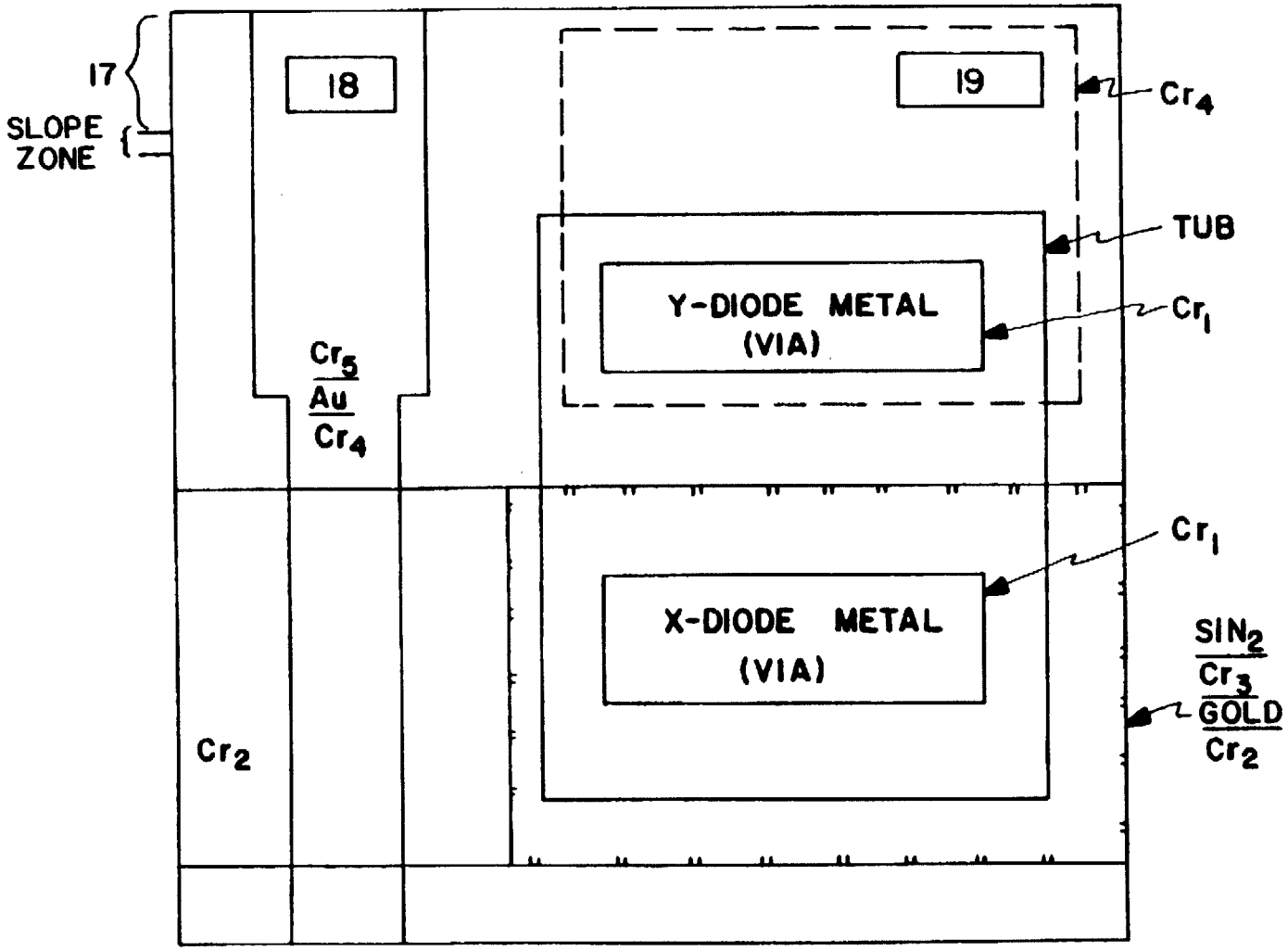
FIG. 2 is a top plan view of the lower level of the two-level detector.

The elevation and/or cross section view of the two-level pitless microbridge bolometer pixel 10 is shown in FIG. 1. The device 10 has two levels, an elevated microbridge detector level 11 and a lower level 12. The lower level has a flat surfaced semiconductor substrate 13, such as a single crystal silicon substrate. The surface 14 of the silicon substrate 13 has fabricated thereon several components of in integrated circuit 15 including diodes, x and y bus lines, connections, and contact pads at the ends of the x and y bus lines, the fabrication following conventional silicon IC technology. The integrated circuit 15 is coated with a protective layer of silicon nitride 16. A top plan view of the lower level is shown in FIG. 2 and comprises a y-diode metal (via) and a x-diode metal (via), chrome-gold-chrome x and y bus lines, a y-side bus conductor contact 18, an x-side contact 19, and the silicon nitride protective layer. The valley strip 17 is the area not covered by the elevated detector.

Referring again to FIG. 1, the elevated detector level 11 includes a silicon nitride layer 20, a serpentine metallic resistive layer 21, such as of nickel-iron, often called permalloy, a silicon nitride layer 22 over the layers 20 and 21, and an IR absorber coating 23 over the silicon nitride layer 22. The absorber coating may also be of a nickel-iron alloy. Downwardly extending silicon nitride layers 20' and 22' deposited at the same time during the fabrication make up the four sloping support legs for the elevated detector level. The number of support legs may be greater or less than four. The cavity 26 (approximately 3 microns high) between the two levels is ambient atmosphere. During the fabrication process, however, the cavity 26 was originally filled with a previously deposited layer of easily dissolvable glass or other dissolvable material until the layers 20, 20' and 22, 22' were deposited. Subsequently in the process the glass was dissolved out to leave the cavity. In FIG. 1 the horizontal dimension, as shown, is greatly foreshortened for descriptive purposes. That is, the height of FIG. 1 is greatly exaggerated in the drawing compared to the length in order to show the details of the invention.

Figure 3:
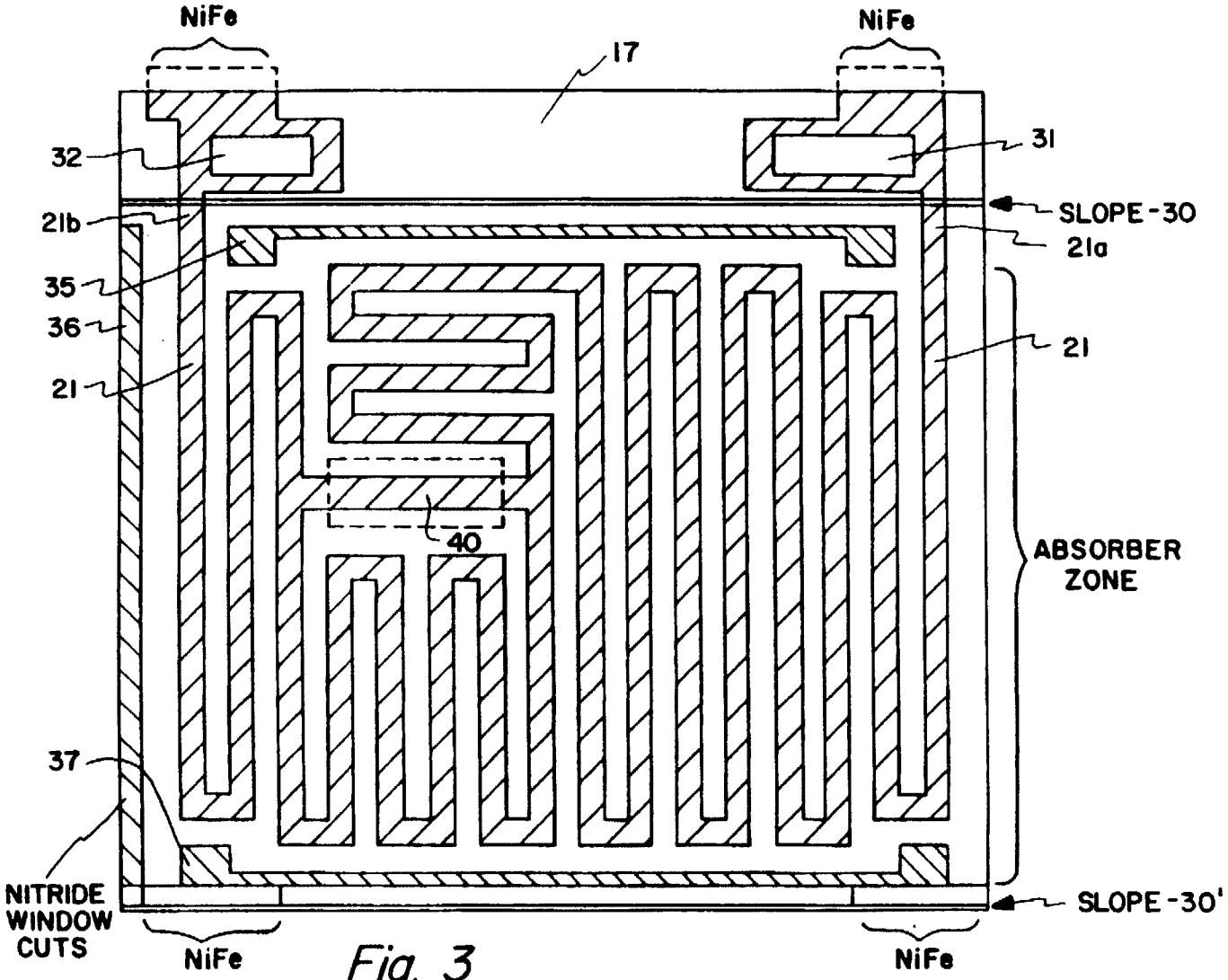
FIG. 3 is a plan view of the top plane of the detector.

FIG. 3 is a top plan view of the elevated detector level 11. This drawing is made as though the overlying absorber coating 23 and upper silicon nitride layer 22 are transparent so the tine resistive layer path 21 can be shown. The exact layout of the serpentine pattern 21 is not significant to the invention. The resistive lines and spaces may be about 1.5 micron. Permalloy was selected as the material for the resistive path 21 in one embodiment because of its relatively high resistivity together with a good temperature coefficient of resistance. In one embodiment, the [resistivity] *resistance* was on the order of 2500 ohms, with a fill factor of about 75%. The ends of the resistive paths 21a and 21b are continued down the slope area 30 to make electrical contact with pads 31 and 32 on the lower level.

Figure 3A:
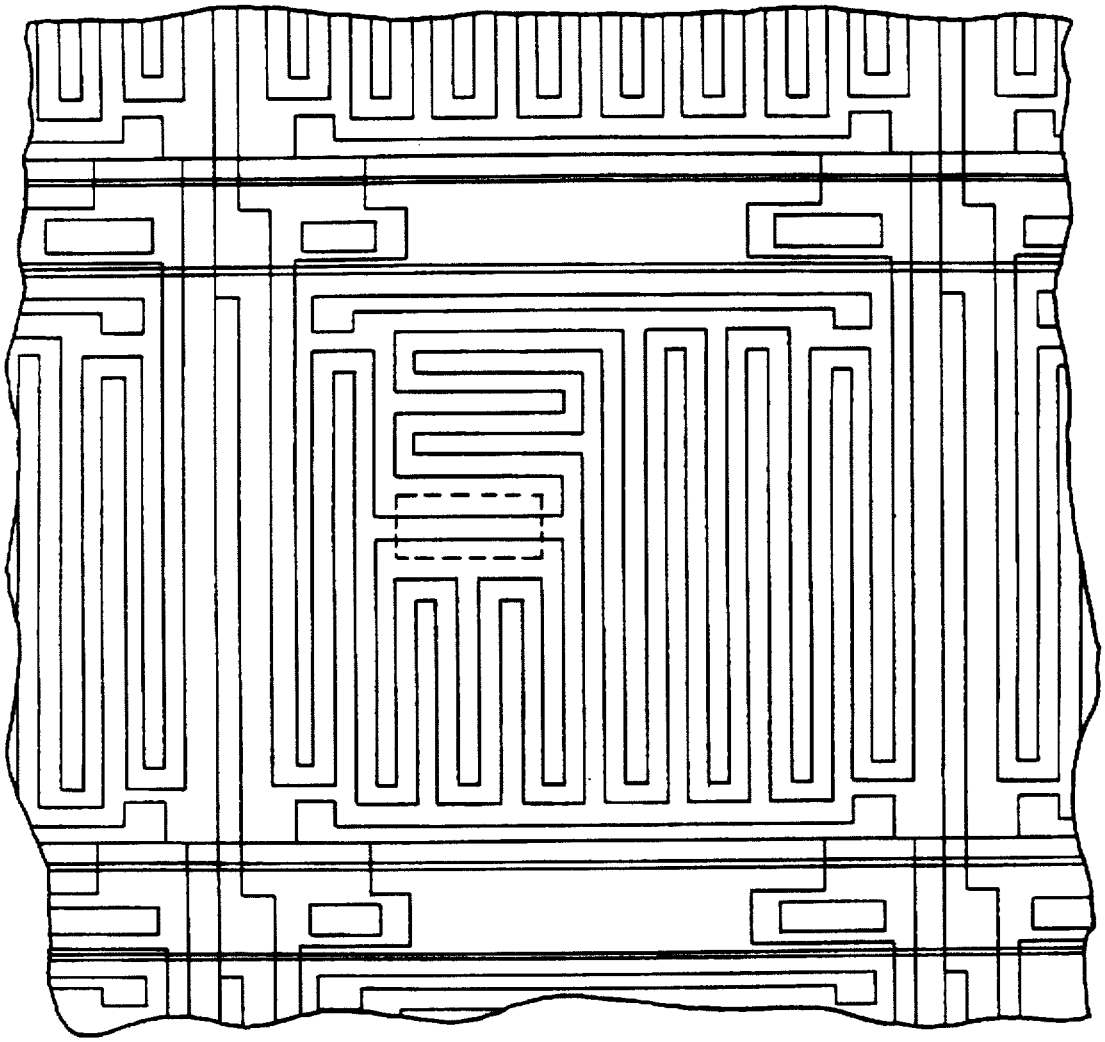
FIG. 3a shows adjoining detectors.

FIG. 3 also shows nitride window cuts 35, 36 and 37 which are opened through the silicon nitride layers 20 and 22 to provide access to the phos-glass beneath for dissolving it from beneath the detector plane. These nitride cuts may be made by ion milling or other suitable process It may be noted that the ion milled cuts 35, 36, 37 to provide this access are very narrow (<2 microns) and are shared with adjacent pixels on the sides, (see FIG. 3a), thus maximizing the area available to the detector and thus maximizing the resulting fill-factor. The four supporting legs may be as short or as long as necessary to provide adequate support and thermal isolation. With the detector thickness of 3000A or less, the thermal impedance is high over the entire detector film. Consequently, short legs should not contribute excessively to the conductance, FIG. 3a shows that the adjacent identical pixels are in close proximity.

Figure 4:
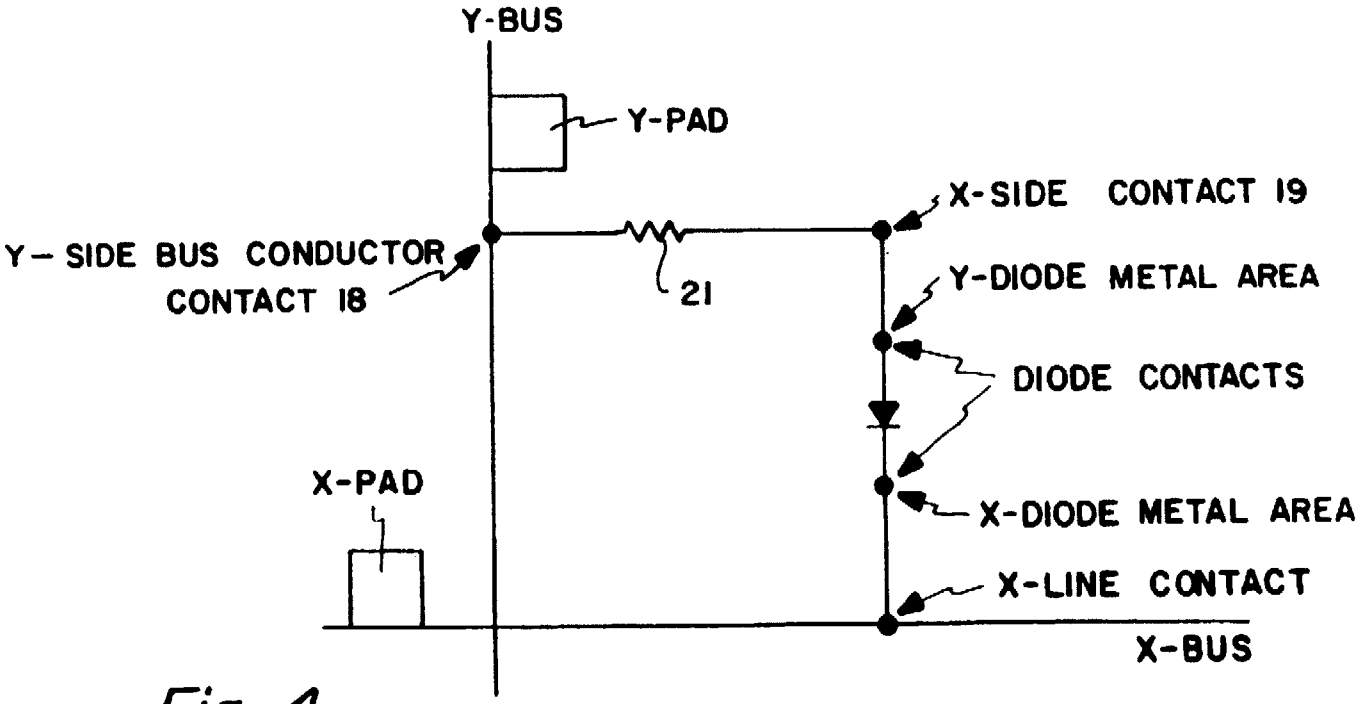
FIG. 4 is a schematic representation of a pixel circuit and connections.

FIG. 4 is a schematic representation of a pixel circuit shown in the other figures comprising the sensing element 21 and the connections to it which are clearly labeled on the drawing.

Figure 6:
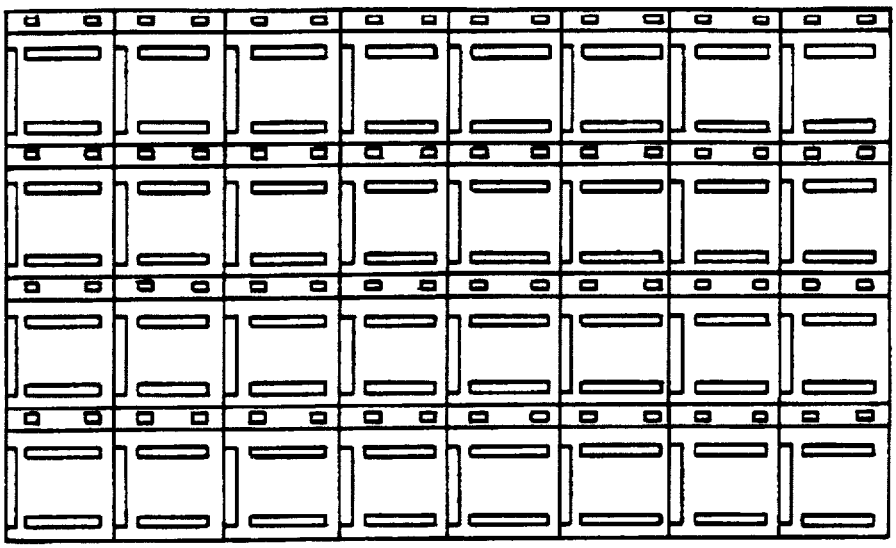
FIGS. 5 and 6 show perspective and top views of an array of the two level detectors.
Figure 5:
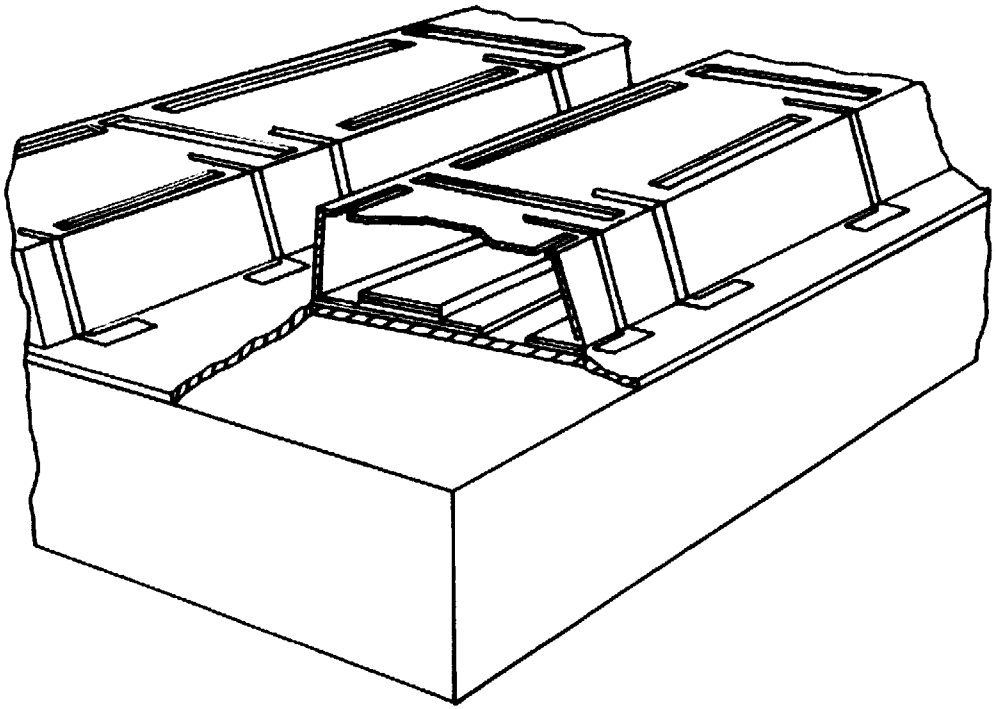

Although the description has been basically in terms of individual detector pixels, the invention is directed to an x,y array assembly of adjoining pixels forming an imaging or mosaic detector array. Each pixel assembly may cover an area about 50 microns on a side, for example. FIG. 5 and 6 as well as FIG. 3 show a section of the array. FIG. 5 shows in perspective the sensing ridges of abutting sensors in a column. This figure is partially cutaway to show the lower level and the cavity as well. The ridges may be about 40 microns wide, so that the elevated detector pixels 11 are on the order of 50×40 microns.

FIG. 6 is a top view block diagram of FIG. 5. In the operation of an array of this general type a suitable IR lens system is usually used to focus a scene onto the array of pixels. A chopper may be used if desired to interrupt the incoming IR energy in synchronism with the related utilizing video electronics. The focused scene heats each pixel according to the energy of the received scene at each pixel position and changes the resistance of the resistive layer 21 according to the pixel temperature.

Further described below is a sequence of fabrication steps for the upper level. Following the deposition of the silicon nitride layer 16 in fabricating the lower level 12 and the cuts of the x-side contact area 19, the y-side bus conductor contact area 18, the cuts of the x-pads and y-pads, the lower level of electronic components and conductors is complete. The construction of the upper level 11 is then ready to commence. A layer of phos-glass or other easily soluble material approximately 3 microns thick is deposited and delineated along x-direction strips and the strip slopes 30 and 30' are thoroughly rounded to eliminate slope coverage problems. In the delineation the glass is cut to less than one micron on the strip 17. The remaining glass is cut to open the strip, and the external glass areas including the x-pad and y-pad. The upper plane silicon nitride base layer 20 is then deposited, the nickel-iron resistance layer 21 is deposited, delineated, and connected to the lower [plan] *plane* contacts 18 and 19, and covered with silicone nitride passivation layer 22. The trim site 40 (FIG. 3) is cut, x-pads and y-pads are opened, the absorber coating 23 is deposited and delineated, and finally the side slots 35, 36 and 37 are ion milled allowing the phos-glass to be dissolved from beneath the detector plane.

The embodiments of the invention in which an exclusive property or rights is claimed are defined as follows:

1. A two-level microbridge bolometer imaging array comprising:

an array of bolometer pixels on a semiconductor substrate, each one of said pixels having a lower section on the surface of the substrate and a microbridge upper detector plane spaced from and immediately above the lower section;

said lower section including a semiconductor diode, x and y bus lines and x and y pads;

said microbridge upper detector plane comprising a bridging dielectric layer having embedded throughout a temperature responsive resistive element having first and second terminals, said microbridge upper detector plane being supported above the lower section by dielectric leg portions which are downward extending continuation of the bridging dielectric layer;

said first and second terminals being continued down said leg portions to said diode and one of said bus lines.

2. The imaging array according to claim 1 wherein said dielectric layer is of silicon nitride.

3. The imaging array according to claim 2 wherein said silicon nitride layer comprises a first layer beneath said temperature responsive resistive element and a second layer over said first layer and said element.

4. The imaging array according to claim 1 wherein said temperature responsive resistive element is of a nickel-iron alloy.

5. The imaging array according to claim 1 wherein the microbridge upper detector plane is raised about 3 microns above the lower section.

6. The method of fabricating a two-level microbridge bolometer imaging array comprising the steps of:

forming on a silicon substrate a lower level of diodes and other components, column and row bus conductors, and x and y contact pads covered by a first dielectric;

opening contact areas through the first dielectric to one of said bus conductors and to one of said diodes contact areas in each pixel of the array, and to said x and y contact pads at the ends of the bus lines;

coating said first dielectric with a layer of glass;

cutting narrow valleys through the glass along the array column conductors and removing the glass from outside the area of the array, and sloping the edges of the remaining glass ridges to accept further coating;

coating the glass ridges and edges with a first thin film layer of silicon nitride;

opening contact areas through the first layer of silicon nitride to one of said bus conductors, and one of said diodes in each pixel of the array, and to the x and y pads;

patterning on the first layer of silicon nitride on each pixel and between the bus line contact area and the diode contact area on each pixel, a separation path of resistive metal which has a substantial temperature coefficient of resistance;

adding a second layer of silicon nitride over the first and over the resistive metal path to passify it, said silicon nitride layers forming an elevated plane;

cutting a narrow slit through the silicon nitride to the glass between adjoining pixels, and cutting additional narrow slits in each pixel area to provide further access to the glass, and cutting the nitride from the x and y pad areas; and dissolving the glass beneath the silicon nitride layers to leave a cavity between the lower level and the elevated plane.

7. The method according to claim 6 wherein said first dielectric is of silicon nitride.

8. The method according to claim 6 wherein the resistive metal is an alloy of nickel-iron.

9. The method according to claim 6 wherein the layer thickness of the glass is about three microns.

10. The method according to claim 6 wherein the cavity is about three microns high.

*11. A two-level microbridge infrared thermal detector apparatus comprising:*

*a pixel on a semiconductor substrate, said pixel having a lower section on the surface of said substrate and a microbridge upper detector plane section spaced from and immediately above the lower section;*

*said lower section including integrated circuit means;*

*said microbridge upper detector section comprising a bridging dielectric layer having mounted thereon a temperature responsive detector having first and second terminals, said microbridge upper detector section being supported above said lower section by dielectric leg portions which are downward extending continuations of the bridging dielectric layer; and*

*said first and second terminals being continued down said leg portions to said integrated circuit means.*

*12. The detector apparatus according to claim 11 wherein said dielectric layer is of silicon nitride.*

*13. The detector apparatus according to claim 12 wherein said silicon nitride layer comprises a first layer beneath said temperature responsive means and a second layer over said first layer and said temperature responsive means.*

*14. The detector apparatus according to claim 11 wherein said temperature responsive means is of a nickel-iron alloy type resistive element.*

*15. The detector apparatus according to claim 11 wherein the microbridge upper detector section is raised about 3 microns above said lower section.*

*16. The detector apparatus according to claim 11 wherein said upper detector plane section includes an infrared absorber coating over said temperature responsive means.*

*17. A two-level microbridge uncooled infrared thermal detector array comprising:*

*an array of pixels on a semiconductor substrate, each one of said pixels having a lower section on the surface of said substrate and a microbridge upper detector section spaced from and immediately above the lower section;*

*said lower section including integrated circuit means;*

*said microbridge upper detector section comprising a bridging dielectric layer having mounted thereon a temperature responsive detector having first and second terminals, said microbridge upper detector section being supported above said lower section by dielectric leg portions which are downward extending continuations of the bridging dielectric layer; and*

*said first and second terminals being continued down said leg portions to said integrated circuit means.*

*18. The detector array according to claim 17 wherein said dielectric layer is of silicon nitride.*

*19. The detector array according to claim 18 wherein said silicon nitride layer comprises a first layer beneath said temperature responsive means and a second layer over said first layer and said temperature responsive means.*

*20. The detector array according to claim 17 wherein said temperature responsive means is a nickel-iron alloy type resistive element.*

*21. The detector array according to claim 17 wherein the microbridge upper detector section is a plane raised about 3 microns above the lower section.*

*22. The detector array according to claim 17 wherein said upper detector section includes an infrared absorber coating over said temperature responsive means.*

*23. The method of fabricating an array of two-level microbridge bolometer pixels comprising the steps of:*

*forming on a silicon substrate a lower level of integrated circuit means having at least two contacts per pixel covered by a first dielectric;*

*opening contact areas for each pixel through said first dielectric to said two contacts of said integrated circuit means;*

*coating said first dielectric with a layer of dissolvable material;*

*cutting narrow valleys through said dissolvable material to form ridges, removing the dissolvable material from said contacts and from outside the areas of the array, and sloping the edges of the remaining dissolvable material ridges to accent further coating;*

*coating the dissolvable material ridges and edges with a first thin film dielectric bridging layer;*

*opening contact areas through the first dielectric bridging layer to said contacts;*

*depositing on said first dielectric bridging layer of each pixel a thin film layer of resistive material which has a substantial temperature coefficient of resistance;*

*patterning a separation path having two ends in said thin film layer of resistive material including connecting, via said sloping edges, said ends of said path respectively, to said contacts;*

*adding a second thin film layer of dielectric material over said first bridging layer and over said patterned resistive material path to passify it, said dielectric layers and said resistive material forming an elevated plane;*

*cutting a narrow slit through said dielectric layers to the dissolvable material between adjoining pixels, cutting additional narrow slits in each pixel area to provide further access to the dissolvable material; and*

*dissolving the dissolvable material beneath said dielectric layers to leave a cavity between said lower level and said elevated plane.*

*24. The method according to claim 23 wherein said first dielectric and said bridging dielectric layers are of silicon nitride.*

*25. The method according to claim 23 wherein the resistive material is an alloy of nickel-iron.*

*26. The method according to claim 23 wherein the layer thickness of the dissolvable material is about three microns.*

*27. The method according to claim 23 wherein said cavity is about three microns high.*

*28. The method according to claim 23 wherein an absorber thin film coating is deposited and delineated on said elevated plane prior to said cutting.*

*29. The method according to claim 23 wherein said dissolvable material is glass.*

*30. The method of fabricating an array of two-level microbridge infrared thermal detector pixels comprising the steps of:*

*forming on a silicon substrate a lower level of integrated circuit means having at least two contacts per pixel covered by a first dielectric;*

*opening contact areas for each pixel through said first dielectric to said two contacts of said integrated circuit means;*

*coating said first dielectric with a layer of dissolvable material;*

*cutting narrow valleys through said dissolvable material to form ridges, removing the dissolvable material from said contacts and from outside the areas of the array and sloping the edges of the remaining dissolvable material ridges to accept further coating;*

*coating the dissolvable material ridges and edges with a first thin film dielectric bridging layer;*

*opening contact areas through the first dielectric bridging layer to said contacts;*

*depositing on said first dielectric bridging layer of each pixel a thin film layer of resistive material which has a substantial temperature coefficient of resistance;*

*depositing on said first dielectric bridging layer of each pixel a thermal detector means which has (i) a significant change in characteristics as a function of temperature, and (ii) two contacts electrically connected via said sloping edges, respectively, to said two contacts of each pixel;*

*adding a second thin film layer of dielectric material over said temperature responsive means and said first bridging layer, said dielectric layers and said temperature responsive means forming an elevated plane;*

*cutting a narrow slit through said dielectric layers to the dissolvable material between adjoining pixels, cutting additional narrow slits in each pixel area to provide further access to the dissolvable material; and*

*dissolving the dissolvable material beneath said dielectric layers to leave a cavity between said lower level and said elevated plane.*

*31. The method according to claim 30 wherein the layer thickness of the dissolvable material is about three microns.*

*32. The method according to claim 30 wherein said cavity is about three microns high.*

*33. The method according to claim 30 wherein an absorber thin film coating is deposited and delineated on said elevated plane prior to said cutting.*

*34. The method according to claim 30 wherein said dissolvable material is glass.*

* * * * *